(12) United States Patent
Mozak et al.

(10) Patent No.: US 8,582,374 B2
(45) Date of Patent: Nov. 12, 2013

(54) METHOD AND APPARATUS FOR DYNAMICALLY ADJUSTING VOLTAGE REFERENCE TO OPTIMIZE AN I/O SYSTEM

(75) Inventors: Christopher Mozak, Beaverton, OR (US); Kevin Moore, Chapin, SC (US); John V. Lovelace, Irmo, SC (US); Zale Theodore Schoenborn, Portland, OR (US); Bryan L. Spry, Portland, OR (US); Chris Yunker, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 366 days.

(21) Appl. No.: 12/638,887

(22) Filed: Dec. 15, 2009

(65) Prior Publication Data

US 2011/0141827 A1    Jun. 16, 2011

(51) Int. Cl.
*G11C 5/14*    (2006.01)

(52) U.S. Cl.
USPC .............. 365/189.09; 365/206; 365/189.11; 327/538; 327/530

(58) Field of Classification Search
USPC ......... 365/189.09, 189.11, 206; 327/538, 530
See application file for complete search history.

(56) References Cited

U.S. PATENT DOCUMENTS

| | | | | |
|---|---|---|---|---|
| 5,243,625 A | * | 9/1993 | Verbakel et al. | 375/317 |
| 5,982,161 A | * | 11/1999 | Nguyen et al. | 323/284 |
| 6,052,307 A | * | 4/2000 | Huber et al. | 365/185.21 |
| 6,069,471 A | * | 5/2000 | Nguyen | 323/271 |
| 6,104,651 A | | 8/2000 | Cowles et al. | |
| 6,140,860 A | * | 10/2000 | Sandhu et al. | 327/513 |
| 6,353,403 B1 | * | 3/2002 | Williams | 341/144 |
| 6,499,131 B1 | | 12/2002 | Savithri et al. | |
| 6,680,642 B2 | * | 1/2004 | Edell et al. | 327/538 |
| 6,728,133 B2 | * | 4/2004 | Shimizu | 365/185.03 |
| 6,969,976 B1 | * | 11/2005 | Broach et al. | 323/222 |
| 7,036,053 B2 | * | 4/2006 | Zumkehr et al. | 714/709 |
| 7,248,640 B2 | * | 7/2007 | Gorecki et al. | 375/287 |
| 7,299,380 B2 | * | 11/2007 | Miller | 714/25 |
| 7,417,459 B2 | | 8/2008 | Wilson et al. | |
| 7,489,121 B2 | * | 2/2009 | Qiu et al. | 323/288 |
| 7,541,795 B1 | * | 6/2009 | Smith et al. | 323/285 |
| 7,720,141 B2 | * | 5/2010 | Fang et al. | 375/233 |

(Continued)

OTHER PUBLICATIONS

U.S. Appl. No. 11/628,103, filed Nov. 30, 2009.

(Continued)

*Primary Examiner* — Viet Q Nguyen
(74) *Attorney, Agent, or Firm* — Blakely, Sokoloff, Taylor & Zafman LLP

(57) ABSTRACT

Described herein is an apparatus for dynamically adjusting a voltage reference level for optimizing an I/O system to achieve a certain performance metric. The apparatus comprises: a voltage reference generator to generate a voltage reference; and a dynamic voltage reference control unit, coupled with the voltage reference generator, to dynamically adjust a level of the voltage reference in response to an event. The apparatus is used to perform the method comprising: generating a voltage reference for an input/output (I/O) system; determining a worst case voltage level of the voltage reference; dynamically adjusting, via a dynamic voltage reference control unit, the voltage reference level based on determining the worst case voltage level; and computing a center of an asymmetrical eye based on the dynamically adjusted voltage reference level.

19 Claims, 6 Drawing Sheets

(56) References Cited

U.S. PATENT DOCUMENTS

| | | | |
|---|---|---|---|
| 7,853,842 B2 * | 12/2010 | Kim et al. | 714/721 |
| 8,089,813 B2 * | 1/2012 | Dreps | 365/185.2 |
| 2002/0078615 A1 * | 6/2002 | Danner et al. | 42/69.01 |
| 2004/0123207 A1 | 6/2004 | Zumkehr et al. | |
| 2005/0259774 A1 | 11/2005 | Garlepp | |
| 2010/0001703 A1 * | 1/2010 | Williams | 323/283 |

OTHER PUBLICATIONS

"Notice of Allowance for U.S. Appl. No. 12/628,103", Mailed Jan. 5, 2012, 9 Pages.

"Notice of Allowance for U.S. Appl. No. 12/628,103", Mailed Apr. 6, 2012, 10 Pages.

Notice of Allowance mailed Jul. 24, 2012 for U.S. Appl. No. 12/628,103.

* cited by examiner

METHOD AND APPARATUS FOR DYNAMICALLY ADJUSTING VOLTAGE REFERENCE TO OPTIMIZE AN I/O SYSTEM

FIELD OF THE INVENTION

Embodiments of the invention relate generally to the field of voltage reference control for input/output (I/O) circuits and more particularly to methods and apparatus for dynamically controlling voltage reference for a Dual In-line Memory Module (DIMM) of a Dynamic Random Access Memory (DRAM).

BACKGROUND

As input/output (I/O) buffers become more complicated in design, optimizing and/or debugging the I/O systems for high volume manufacturing (HVM) becomes challenging. One possible reason for such challenge is that processors having modern I/O buffers are optimized to perform at a specific power consumption envelope for a fixed I/O voltage reference level. The voltage reference for the I/O system is used in the sense amplifiers of the receivers of the I/O buffers to determine the value of the incoming data. Generally, such voltage reference is set to a level which is a fraction of the I/O power supply, for example, ½ VCC or ⅔ VCC. Optimization of the I/O systems is then performed at those fixed I/O voltage reference levels. Optimization means setting the properties of the I/O buffers so that the I/O buffers operate in a particular power envelope, drive the I/O signals at a specific speed, maintain a certain timing margin for the I/O signals, operate within certain noise levels (crosstalk, overshoot, undershoot, ground bounce, ring back), etc.

However, improved and accurate optimization of an I/O buffer depends on the system in which the I/O buffer operates. This means that for every different type of I/O system, a different voltage reference level may be selected as its fixed voltage reference to achieve the optimized performance metrics of the I/O system. Such a customized fixed voltage reference increases the cost of HVM because it is expensive to change the fixed voltage reference to a new level for every different I/O system. Furthermore, the presence of the voltage reference generator off die on the motherboard requires special external cards to interface with the motherboard to override the fixed voltage reference level to a new level for I/O system optimization. Such external cards also increase the cost of HVM.

For example, a double data rate (DDR) interface of a Dynamic Random Access Memory (DRAM) operates with a fixed reference voltage for the DDR's Dual In-Line Memory Module (DIMM). Generally, the fixed reference voltage is set to ½ VCC level. Such fixed reference voltage is used by the DRAM to decide if the received data in its memory is a logical one or zero. Statically setting this voltage reference limits the ability to achieve the optimal DRAM operation point for a given I/O system. Such a fixed voltage reference also limits the ability to test DRAMs at HVM because external interface cards on the motherboards are needed to override fixed voltage reference levels for the DRAM sense amplifiers and to determine I/O system margins for various voltage reference levels.

BRIEF DESCRIPTION OF THE DRAWINGS

Embodiments of the invention will be understood more fully from the detailed description given below and from the accompanying drawings of various embodiments of the invention, which, however, should not be taken to limit the invention to the specific embodiments, but are for explanation and understanding only.

DETAILED DESCRIPTION

Embodiments of the invention discuss a method and apparatus of dynamic voltage reference control for a Dual In-Line Memory Module (DIMM) in double data rate (DDR) interface system. Such a dynamic voltage reference generator allows for improved optimization of the DDR system during boot time for power consumption, timing margins, voltage margins, I/O parameters such as I/O driver drive strength, termination impedance, etc.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Figure 1A:
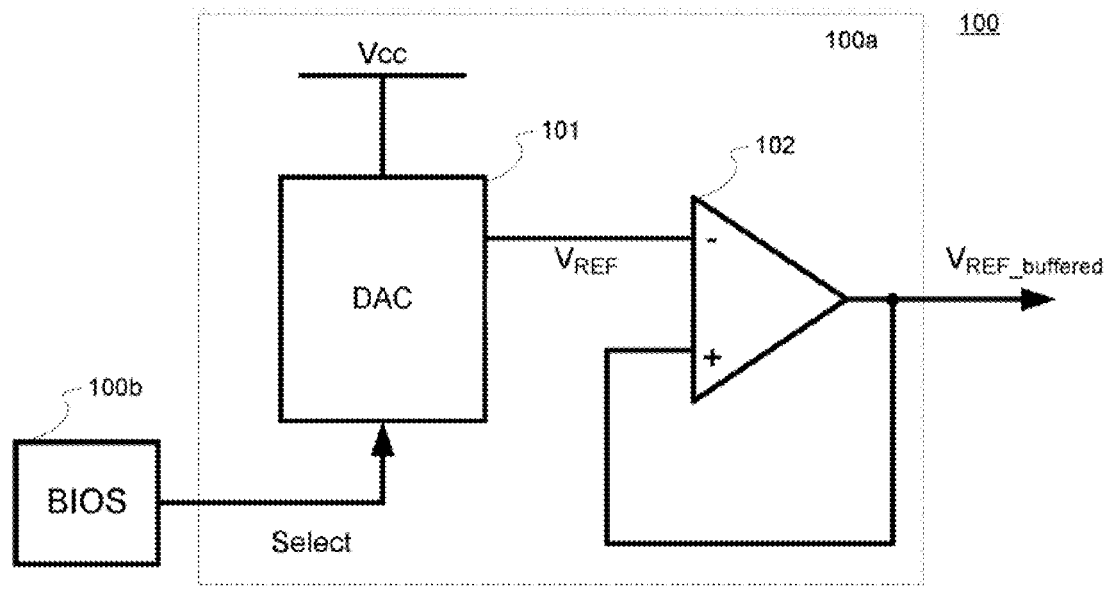
FIG. 1A illustrates a dynamic voltage reference control unit, according to one embodiment of the invention.

FIG. 1A illustrates a high level implementation of a dynamic voltage reference control unit 100 according to one embodiment of the invention. The dynamic voltage reference control unit 100 includes a dynamic reference generator 100a and a dynamic reference select control unit 100b. In one embodiment, the dynamic reference select control unit 100b is operable by a Basic Input Output System (BIOS). In one embodiment, the dynamic reference select control unit 100b is the BIOS. The BIOS is boot firmware, designed to be the first software executed by a computer when powered on.

In one embodiment, the voltage reference (Vref) generator 101 of the dynamic reference generator 100a is implemented as a digital to analog converter (DAC) having a resistor ladder stack configured for selecting a specific value of the Vref via the select signal. The output of the Vref generator 101 is buffered via an analog buffer 102 and sent to input/output (I/O) buffers. In one embodiment, the analog buffer 102 comprises a voltage follower implemented as a unit gain operational amplifier (OPAMP). In one embodiment, the output impedance of the DAC 101 is higher than the embodiment in which the OPAMP 102 is removed. The high output impedance of the DAC 101 allows for a smaller DAC size die area and thus lower power dissipation as compared to the DAC 101 with low output impedance in the embodiment without the OPAMP 102.

Figure 1B:
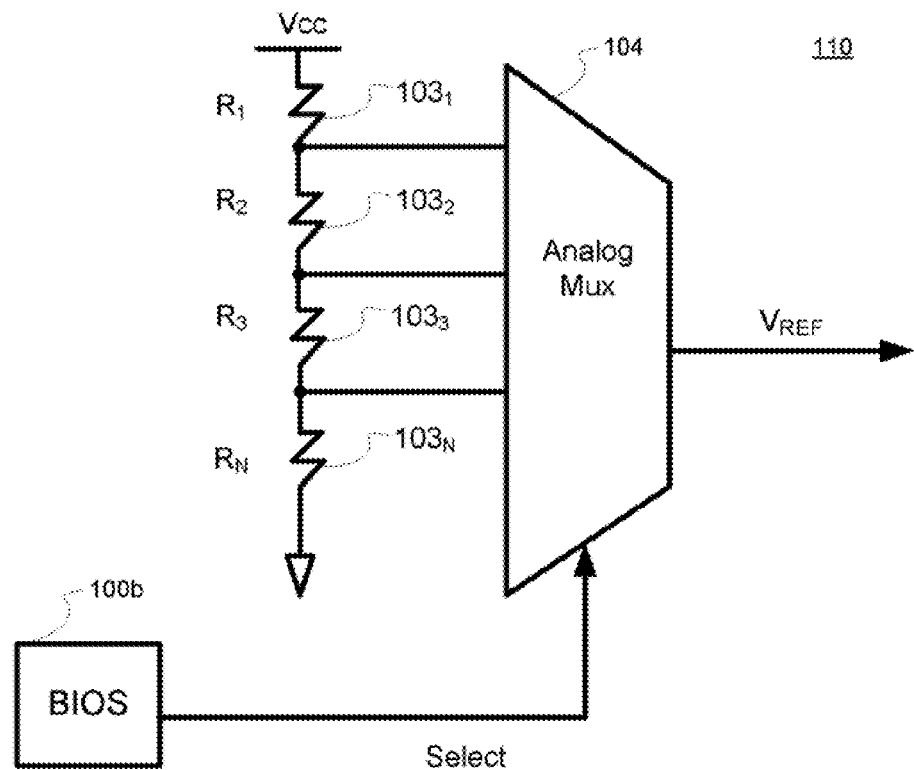
FIG. 1B illustrates a resistor stack of a dynamic voltage reference generator, according to one embodiment of the invention.

FIG. 1B illustrates the Vref generator 110 implemented as a resistor stack. The resistors $103_{1-N}$ divide the power supply voltage VCC into fractions of VCC that are selectable via an analog multiplexer 104. In one embodiment, the analog multiplexer 104 is implemented via transmission gates controlled by the select signal. In one embodiment, the output of the multiplexer Vref is buffered via the unity gain OPMAP 102. In one embodiment, a wiper (not shown) is used to select a Vref level from the resistor stack $103_{1-N}$.

In one embodiment, the select signal to the DAC 101 of FIG. 1A or the analog multiplexer 104 of FIG. 1B is controlled by hardware or software. In one embodiment, the select signal is controlled to select a value of Vref via the dynamic reference select control unit 100b (same in FIG. 1A and FIG. 1B). In one embodiment, the dynamic reference select control unit 100b is operable by the BIOS. In one embodiment, the dynamic reference select control unit 100b is the BIOS.

The initial function of the BIOS is to identify, test, and initialize system devices such as the video display card, hard disk, memory, and other hardware such as Dynamic Random Access Memory (DRAM). In one embodiment, the Vref level in the DIMM of the DRAM is dynamically adjusted via the memory reference code (MRC) in the BIOS. In one embodiment, the selection of the Vref via the select signal occurs at boot time of the I/O system. In other embodiments, Vref is selected during normal operation of the I/O system (e.g., outside the boot time of the I/O system). The term dynamic means that the Vref level is adjustable at any time (as opposed to static Vref level) via off-chip or on-chip hardware and/or software.

Figure 2:
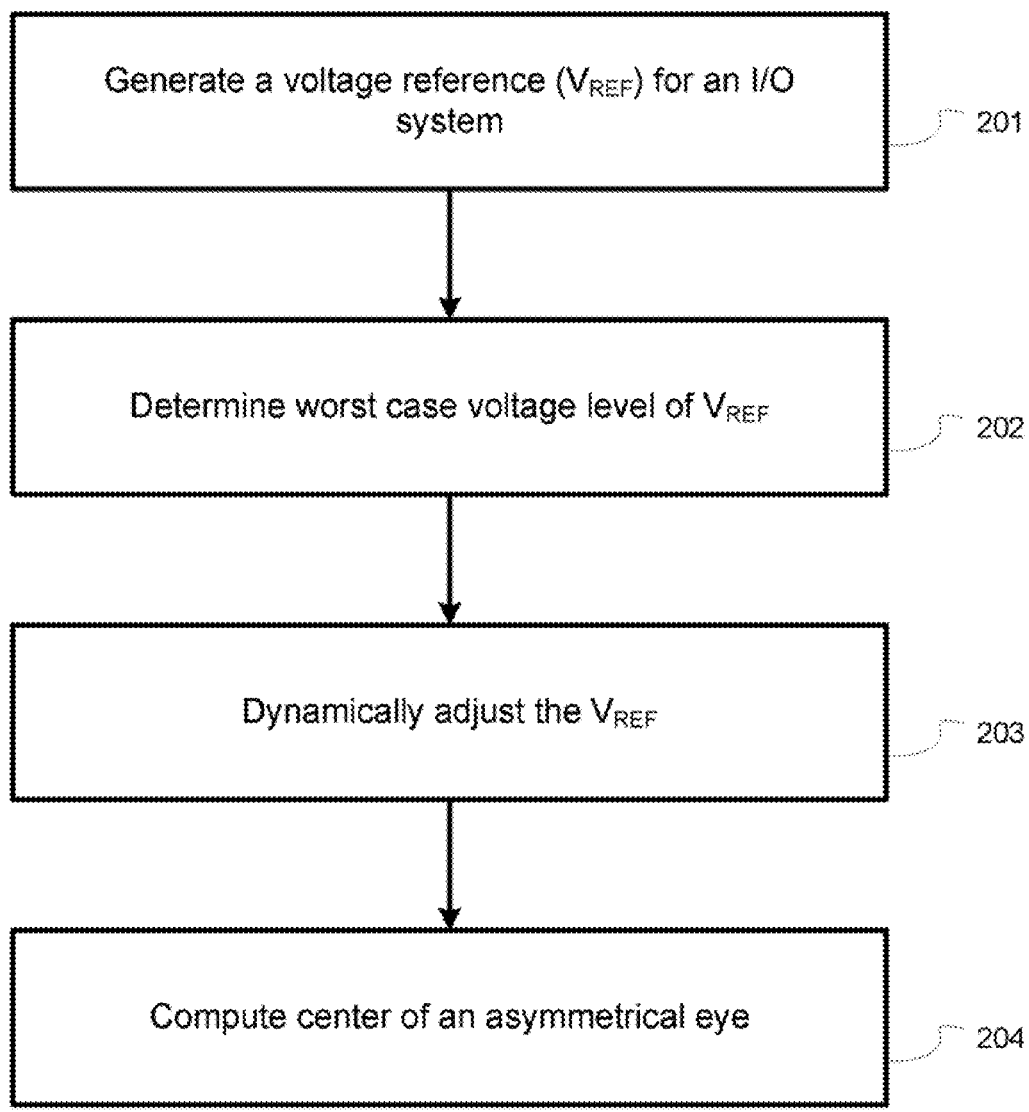
FIG. 2 illustrates a flowchart of a method to center a strobe in an asymmetrical eye of an I/O system via the dynamic voltage reference generator, according to one embodiment of the invention.

FIG. 2 illustrates a flow chart 200 for dynamically adjusting a voltage reference for an I/O system, according to one embodiment of the invention. At block 201, a voltage reference is generated by the Vref generator 101 of FIG. 1A. In one embodiment, Vref is initially set to ½ of VCC (the I/O power supply level). This initially set value of Vref may not be the optimum setting for Vref in view of the system performance metrics (e.g., timing margin, voltage margin, drive strength, impedance, etc.). One reason for the initially set, but non-optimum, value of Vref is noise on the Vref signal. Examples of noise include crosstalk, transmission losses, white noise, etc.

At block 202, a worst case voltage level of Vref is determined. In one embodiment, the worst case voltage reference level of Vref is the level at which the I/O begins to see errors. In one embodiment, the worst case voltage reference level of Vref occurs when a single type of I/O failing condition occurs. Examples of a single type of I/O failing condition include incorrect sampling by a receiver of an I/O of transmitted data by an I/O, exceeding a predetermined allowable bit error rate (errors per second), etc. In one embodiment, the worst case voltage reference level of Vref occurs when multiple types of I/O failing conditions occur. Examples of a multiple types of I/O failing conditions include exceeding a predetermined allowable bit error rate (errors per second), exceeding a predetermined power consumption envelope, etc.

At block 203, the voltage level of the Vref is adjusted by the dynamic voltage reference control unit based on the worst case voltage level of Vref. At block 204, the dynamically adjusted Vref is then used to compute the center of an asymmetrical eye of the I/O system. In one embodiment, the computed center is then used for adjusting the position of a strobe signal (sampling signal) to maximize performance metrics such as timing margin, I/O driver strengths, etc.

In one embodiment, to compute the center of the eye (which is not necessarily the middle of the eye), maximum height of the eye and the width of the eye is measured at the dynamically adjusted Vref (based on the worst case Vref level). The eye of an I/O system is generally asymmetrical in form. Asymmetrical form means that the eye is not exactly oval in shape, but some form of polygon.

As a result of the eye's asymmetrical form, the center of the eye which traditionally results in maximum timing margin in the middle of the eye at nominal Vref settings (e.g., the initially set Vref level at VCC/2) is no longer the ideal center of the eye for maximizing timing margin as a function of Vref levels. In other words, the dynamically adjustable Vref level when used to determine the center of the asymmetrical eye for maximizing timing margin of the I/O system may be significantly different from the center of the asymmetrical eye for maximizing timing margin when Vref level is fixed at its initially set value (e.g., VCC/2).

The position of the strobe signal (sampling signal) is adjusted using multi-dimensional view of the asymmetrical eye which has height and width components. In one embodiment, the height of the eye represents a performance metric (e.g., a timing margin) of the I/O system for minimum and maximum levels of Vref while the width of the eye represents various minimum and maximum levels of the performance metric at a given Vref level. In one embodiment, the center of the asymmetrical eye is computed as the sum of the maximum height and width of the eye and then by dividing that sum by two.

In one embodiment, the left edge 405a of the asymmetrical eye represents the minimum timing margin associated with one or more Vref levels. In one embodiment, the right edge 405b of the asymmetrical eye represents the minimum timing margin associated with one or more Vref levels. In one embodiment, the center of the asymmetrical eye is computed as the sum of timing margins corresponding to the left and the right edges and then dividing the sum by 2.

Figure 3:
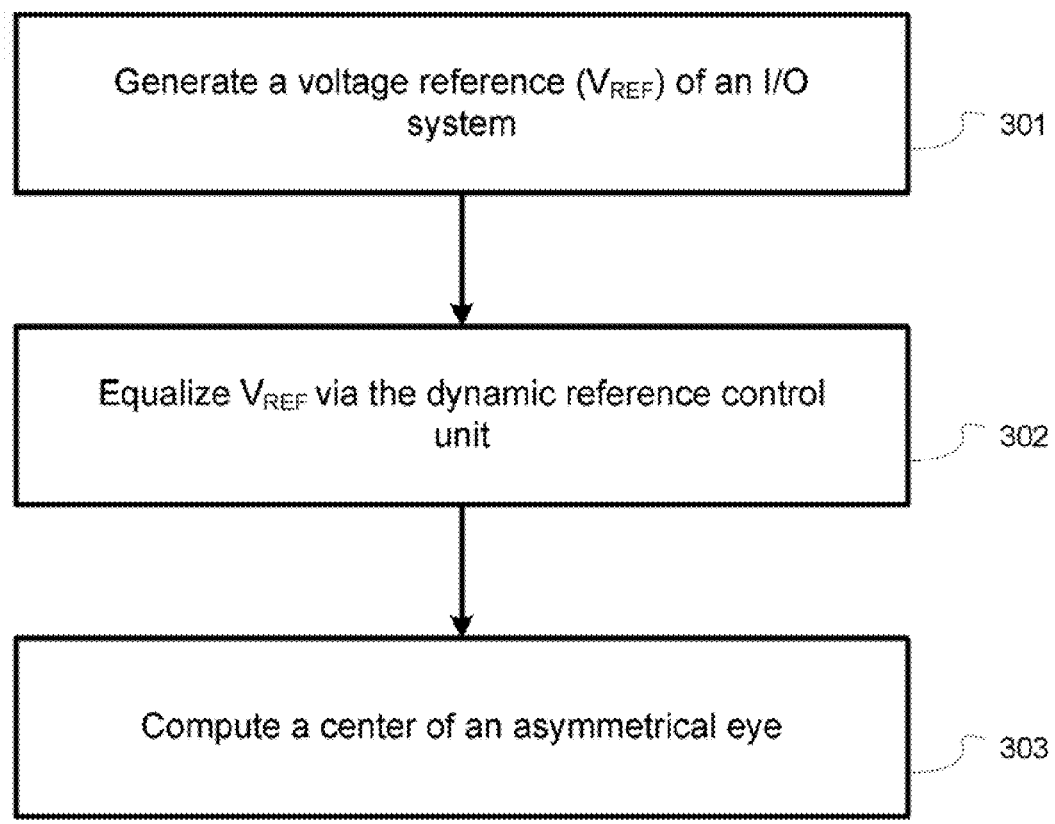
FIG. 3 illustrates a flowchart of a method to equalize a voltage reference of an I/O system via the dynamic voltage reference generator, according to one embodiment of the invention.

FIG. 3 illustrates a flow chart 300 to equalize Vref via the dynamic voltage reference control unit, according to one embodiment of the invention. Equalizing in this context means finding the appropriate value of Vref to achieve a performance metric of the I/O system. As mentioned above, performance metric includes any I/O system parameter such as timing margin, voltage margin, drive strength, impedance, etc.

At block 301, the dynamic voltage reference control unit (e.g., 100 of FIG. 1A) generates a voltage reference Vref for an I/O system. This initial value of Vref is then dynamically adjusted to achieve a performance metric. In one embodiment, the initial value of Vref is set at ½ of VCC.

At block 302, the process of equalization takes place. The process involves raising a level of the voltage reference via the dynamic reference control unit to determine a failing point of the I/O system. A failing point is identified once the I/O system stops operating correctly and begins to receive incorrect data. At the failing point, the Vref level is recorded. The performance metric is also determined at the failing point. In one embodiment, the performance metric is a timing margin of the I/O system.

The voltage reference Vref is then lowered, via the dynamic reference control unit, from the initial value of Vref till the I/O system fails again. In one embodiment, Vref level is adjusted by the BIOS. In another embodiment, the Vref level is adjusted by a compensation circuit having a feedback loop configured to adjust the Vref level in responses to an event. Examples of an event include change in operational temperature, change in system noise level, or any other internal/external event having an impact on the performance of the I/O system.

The voltage reference Vref is recorded at the failing point described above. The performance metric is also recorded at this new failing point. Based on the raised Vref level and the lowered Vref level, which generated failing points of the I/O system, a new Vref level is computed. In one embodiment, the new Vref level is an average of the raised and lowered Vref levels at the failing points. In other embodiments, a skewed average of the raised and lowered Vref levels at the failing points is used to compute a new Vref level. In yet other embodiments, other formulae are used to compute the new Vref level.

At block 303, the new Vref level determined via the equalization process is used to compute a center of an asymmetrical eye. This center is used to re-adjust the position of the sampling strobe signal to achieve the optimized level of I/O system performance based on the performance metric.

Figure 4:
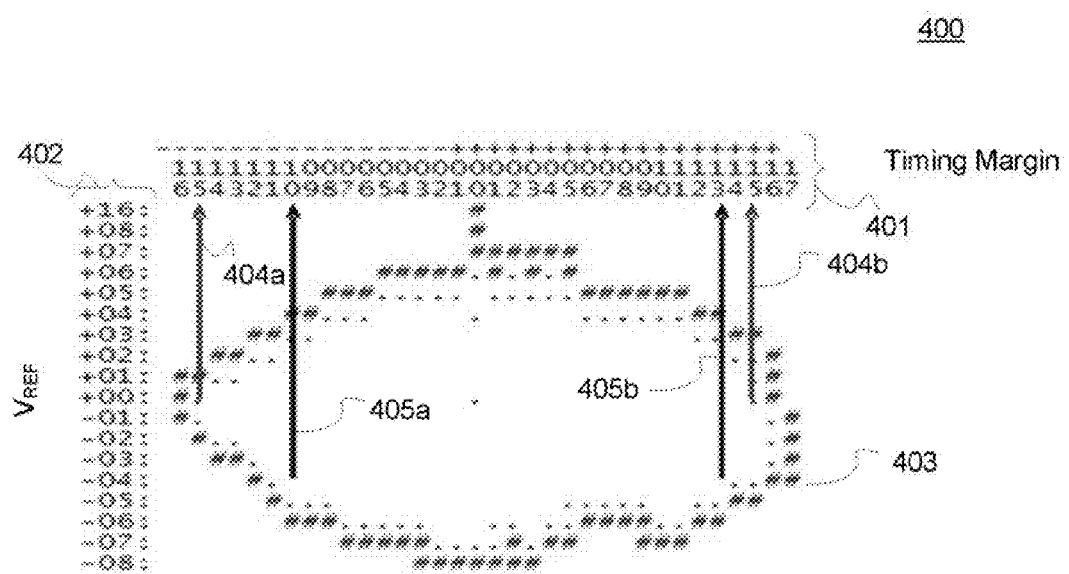
FIG. 4 illustrates an asymmetrical eye with a strobe centered according to the dynamic voltage reference in one embodiment of the invention.

FIG. 4 illustrates an asymmetrical eye 400, of an I/O system, which is constructed in a two-dimensional (2D) form, according to one embodiment of the invention. The x-axis 401 is the timing margin of the I/O system while the y-axis 402 represents various levels of Vref. The center point of Vref is the initial value and is represented by "+00" in the figure. In one embodiment, the initial value of Vref is set to ½ VCC. The dynamic voltage reference control unit dynamically adjusts the Vref level to optimize the performance of the I/O system. For example, the I/O system may be optimized for power consumption, timing margin, voltage margin, drive strength, etc. The "#" sign 403 in FIG. 4 illustrates a failing point of the I/O system. The area within the asymmetrical eye is the passing area of the I/O system, i.e. the area where the I/O system operates properly—sends and receives data correctly. The area outside the asymmetrical eye is the failing area of the I/O system, i.e. the I/O system malfunctions in that area. Malfunction means that the I/O system does not receive correct data at the sampling point.

As mentioned in the background section, I/O systems are optimized at a fixed Vref level, which is generally set at ½ VCC. The eye diagram of such an I/O system is a single dimensional (1D) eye diagram based on that fixed voltage reference Vref level. Indicators 404a and 404b correspond to a performance metric of the I/O system. In this example, indicators 404a and 404b represent timing margins of +/−15 ps at a fixed Vref level of "+00" (e.g., ½ VCC). Each tick on the x-axis, for the above example, represents 1/64 of a unit interval (UI). A UI is defined as how fast data is sent out on an I/O bus of an I/O system, for example for a 1333 MT (megatransfer) I/O data frequency, the UI is 750 ps. Based on this example, a tick on the x-axis is 750/64=12 ps. Therefore, the timing margin of +/−15 ps at a fixed Vref level of "+00" is 12×15=180 ps for a 1333 MT I/O system.

In one embodiment, the 2D eye diagram, as the one shown in FIG. 4, is used to compute a new center for the strobe signal for a different Vref voltage level. Indicators 405a and 405b point to timing margins of an I/O system when Vref is dynamically set to +/−03 levels on the y-axis. In one embodiment, each y-axis tick of Vref represents an 8 mV change in the Vref level. As mentioned above, the ability to dynamically set Vref to various levels allows for constructing a 2D eye diagram for an I/O system. The 2D eye diagram, as opposed to the 1D eye diagram constructed at a nominal Vref level (e.g., VCC/2), provides undiscovered visibility to the performance of the I/O system and thus provides a new avenue for setting the I/O parameters for meeting a particular performance metric of the I/O system.

In one embodiment, to achieve a certain power dissipation level of the I/O system, Vref is adjusted dynamically via the BIOS in view of the timing margin budget (as seen in the 2D eye diagram of FIG. 4) without having to redesign the I/O system. Such flexibility reduces cost of HVM and other manufacturing costs because a single I/O buffer design can be customized to work on different I/O systems by dynamically adjusting Vref levels to achieve a particular performance metric.

If a system administrator, for example, wants to lower the power dissipation of the I/O system at the cost of timing margin for the I/O system, the administrator can dynamically adjust the Vref level to achieve a new timing margin and re-center the strobe signal for proper I/O operation. As mentioned above, strobe signal is a sampling signal to sample data. Generally, the strobe signal is set at the center of a data signal to maximize the timing margins associated with the data signal. The position of the strobe signal can be re-adjusted in view of a dynamically adjusted Vref signal to optimize the I/O system.

One reason for dynamically adjusting the voltage reference Vref level to optimize an I/O system, as opposed to other parameters, is because many I/O system performance parameters, such as crosstalk, inter-symbol interference (ISI), etc., are more easily comprehended in voltage domain than any other domain. Without knowing the operational boundaries of the system in view of how high or low Vref level may be set and still have an operational I/O system, further optimization of the I/O system becomes difficult. Optimizing the I/O system on the basis of timing margin alone (at a fixed Vref level) results in incorrect information regarding the true operational boundaries of the I/O system.

Figure 5:
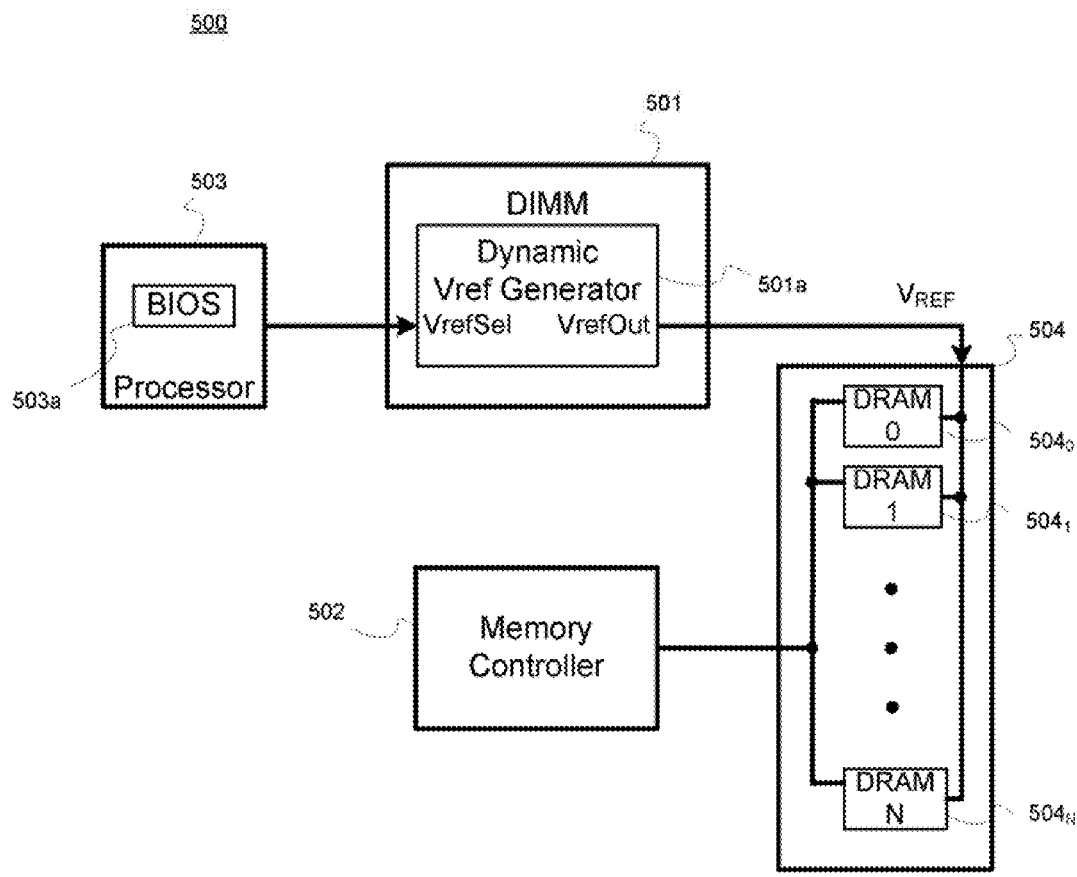
FIG. 5 illustrates a system level view of a dynamic voltage reference control unit implemented in a DIMM coupled with a DRAM, according to one embodiment of the invention.

FIG. 5 illustrates a system level view 500 of the dynamic voltage reference control unit implemented in a DIMM of a DDR (e.g., DIMM of DDR4) interface in a DRAM, according to one embodiment of the invention. In one embodiment, embedded in the DIMM 501 is the dynamic voltage reference generator and control unit 501a. In one embodiment, a BIOS 503a (same as BIOS 100b in FIG. 1A and FIG. 1B) on a processor 503 adjusts the Vref level via the dynamic voltage generator 501a. The output of the dynamic voltage reference generator and control unit 501a is received by one or more DRAM units $504_{0-N}$ in a DRAM module 504. In one embodiment, a memory controller 502 enables the operation of a DRAM unit from the DRAM units $504_{0-N}$. The embodiments described above allow for debugging and optimizing a single DRAM design to operate at multiple I/O conditions.

For example, if a vendor of a DDR4 experiences a failing DRAM 504 because it does not store or read data correctly, Vref level in the DIMM 501 can be dynamically adjusted via the BIOS 503a to vary the timing margin or other parameters of an I/O buffer and so place the system in operational condition. In one embodiment, the sampling signal (the strobe signal) is re-calibrated to a new center in view of the new dynamically adjusted Vref level.

In one embodiment, the dynamic voltage reference control unit (of FIG. 1A and FIG. 1B) is used to measure the Vref margin of an I/O system (in various process, voltage, temperature conditions) in HVM without the need for measuring other parameters for the I/O system. The dynamic voltage reference control unit, thus, reduces the cost of HVM and brings the I/O system to market faster than in situations when Vref was statically fixed for every I/O system. Having the ability to dynamically adjust (via the BIOS) the Vref level in the DIMM enhances the ability to debug a non-operational DRAM and to make it operational at a new Vref level without having to manually override a fixed Vref level from motherboard components.

In one embodiment, the dynamic voltage reference control unit is located on die. In another embodiment, the dynamic voltage reference control unit is located off-chip on the motherboard.

Figure 6:
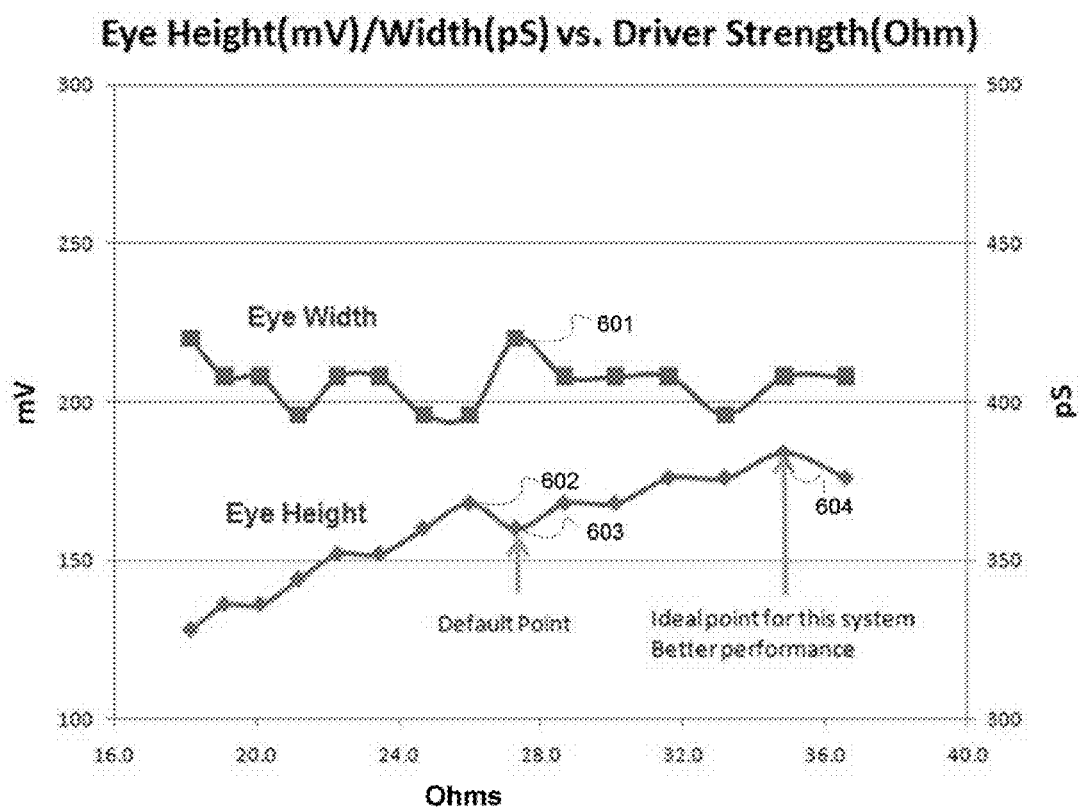
FIG. 6 illustrates a graph showing the effect of eye width and height on drive strength of an I/O buffer for various voltage reference levels, according to one embodiment of the invention.

FIG. 6 illustrates a graph 600 that shows how the dynamic voltage reference control unit optimizes drive strength of an I/O buffer, according to one embodiment of the invention. The two curves on FIG. 6 represent the eye width 601 and eye height 602 of an I/O system. The y-axis on the left is the eye height in mV which corresponds to the Vref level, while y-axis on the right is the eye width in ps (picoseconds) for various Vref levels. The drive strength is represented in impedance (Ohms) and is shown on the x-axis of graph 600. The graph 600 illustrates that when the eye width alone (as shown by 601) is used to determine the optimized drive strength of the I/O buffers, then there is no real practical trend in the eye width response versus the driver strength. The near flat response of 601 shows that there is no real practical trend in the eye width response versus the driver strength. This means that optimizing the I/O for a particular performance metric, in this case the I/O driver strength, via width alone is not a proper means for optimizing drive strength—adjusting Vref in this case does not provide much information because the drive strength does not change with eye width. A 2D eye diagram, however, provides proper means for optimizing drive strength.

In one embodiment, by dynamically adjusting Vref (thus the eye height) optimum drive strength is achieved at point 604. The optimum drive strength point 604 suggests that a weaker (thus smaller) I/O driver (buffer) is needed to achieve the desirable drive strength in the I/O system—weaker compared to the drive strength at the default point 603. A weaker driver will consume less power than a stronger driver. Therefore, the new optimized drive strength point also achieves better power performance of the I/O system. Such optimum drive strength is not easily identifiable with a fixed static voltage reference Vref. Such fixed Vref level would have resulted in non-optimum drive strength setting at 603. Therefore, dynamically adjusting the Vref level via a 2D eye diagram of the I/O allows for optimizing the I/O system in a faster manner which is visibly easier to comprehend.

Elements of embodiments are also provided as a machine-readable medium for storing the computer-executable instructions (e.g., BIOS for controlling the voltage reference level Vref). The machine-readable medium may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the invention may be downloaded as a computer program (e.g., BIOS) which may be transferred from a remote computer (e.g., a server) to a requesting computer (e.g., a client) by way of data signals via a communication link (e.g., a modem or network connection).

In one embodiment, the BIOS sweeps Vref levels by accessing the dynamic voltage reference control unit and executing test patterns on the I/O system for each Vref level and determining an optimized Vref level for the I/O system. Such embodiment allows for dynamically adjusting DIMM Vref levels at boot time and determining an optimized Vref level for the DRAM. As mentioned above, optimization means determining a Vref level that provides targeted power dissipation level for a given I/O system frequency goals.

While the invention has been described in conjunction with specific embodiments thereof, many alternatives, modifications and variations will be apparent to those of ordinary skill in the art in light of the foregoing description.

For example, the resistor ladder in FIG. 1B can be replaced with other digital to analog conversion circuits implemented with transistors instead of resistors. Similarly, the dynamic voltage reference control unit 100 of FIG. 1A can be modified by removing the OPAMP 102 and making the reference generator DAC 101 have a low output impedance. The low output impedance of the DAC 101 is used to drive large capacitive loads.

The methods of optimizing timing margin by re-centering the strobe signal (as illustrated by FIG. 2) via the dynamically adjustable voltage reference control unit, and optimizing the drive strength of the I/O buffer are exemplary uses of the dynamically adjustable voltage reference control unit. Other optimizing methods using the dynamically adjustable voltage reference control unit are also possible.

Embodiments of the invention are intended to embrace all such alternatives, modifications, and variations as to fall within the broad scope of the appended claims.

We claim:

1. An apparatus comprising:
   a voltage reference generator to generate a voltage reference; and
   a dynamic voltage reference control unit, coupled with the voltage reference generator, to dynamically adjust a level of the voltage reference in response to an event, wherein the event includes exceeding a predetermined bit error rate, wherein the dynamic voltage reference control unit is controllable by software.

2. The apparatus of claim 1, further comprising:
   a dynamic random access memory (DRAM); and
   a dual in-line memory module (DIMM), coupled with the DRAM, having the voltage reference generator to provide the dynamically adjusted voltage reference level to the DRAM.

3. The apparatus of claim 2, wherein the voltage reference generator comprises:
   a variable resistor ladder to adjust the level of the voltage reference; and
   a voltage follower, coupled with the variable resistor ladder, to buffer the voltage reference to the DRAM.

4. The apparatus of claim 1, wherein the dynamic voltage reference control unit is operable by a basic input/output system (BIOS).

5. The apparatus of claim 4, wherein the dynamic voltage reference control unit is operable at boot time via the BIOS.

6. The apparatus of claim 1, wherein the event includes a timing failure in an input/output system.

7. An apparatus comprising:
   a voltage reference generator to generate a voltage reference, the voltage reference generator having a voltage follower or coupled to it; and
   a dynamic voltage reference control unit, coupled with the voltage reference generator, to dynamically adjust a level of the voltage reference in response to an event.

8. The apparatus of claim 7, further comprising:
a dual in-line memory module (DIMM), coupled with a DRAM, having the voltage reference generator to provide the dynamically adjusted voltage reference level to the DRAM.

9. The apparatus of claim 8, wherein the voltage reference generator comprises:
a variable resistor ladder to adjust the level of the voltage reference, and
wherein the voltage follower is coupled with the variable resistor ladder to buffer the voltage reference to the DRAM.

10. The apparatus of claim 7, wherein the dynamic voltage reference control unit is controlled by software.

11. The apparatus of claim 7, wherein the dynamic voltage reference control unit is operable by a basic input/output system (BIOS).

12. The apparatus of claim 11, wherein the dynamic voltage reference control unit is operable at boot time via the BIOS.

13. An apparatus comprising:
a voltage reference generator to generate a voltage reference;
a dynamic voltage reference control unit, coupled with the voltage reference generator, to dynamically adjust a level of the voltage reference in response to an event; and
a dual in-line memory module (DIMM), coupled with a DRAM, having the voltage reference generator to provide the dynamically adjusted voltage reference level to the DRAM.

14. The apparatus of claim 13, wherein the voltage reference generator comprises:
a variable resistor ladder to adjust the level of the voltage reference; and
a voltage follower, coupled with the variable resistor ladder, to buffer the voltage reference to the DRAM.

15. The apparatus of claim 13, wherein the dynamic voltage reference control unit is controlled by software.

16. The apparatus of claim 13, wherein the dynamic voltage reference control unit is operable by a basic input/output system (BIOS).

17. The apparatus of claim 13, wherein the event includes a timing failure in an input/output system.

18. The apparatus pf claim 13, wherein the event includes exceeding a predetermined bit error rate.

19. The apparatus of claim 1, wherein the dynamic voltage reference control unit includes a compensation circuit having a feedback loop to adjust a voltage level of the voltage reference.

* * * * *